United States Patent [19]

Takagi et al.

[11] Patent Number: 5,068,626
[45] Date of Patent: Nov. 26, 1991

[54] CHARGE PUMP CIRCUIT

[75] Inventors: Kotaro Takagi, Tokyo; Satoshi Yokoya, Kanagawa, both of Japan

[73] Assignee: Sony Corporation, Tokyo, Japan

[21] Appl. No.: 538,187

[22] Filed: Jun. 13, 1990

[30] Foreign Application Priority Data

Jun. 27, 1989 [JP] Japan ................... 1-165113

[51] Int. Cl.$^5$ .............................................. H03L 7/00
[52] U.S. Cl. ...................................... 331/17; 331/25
[58] Field of Search .................... 331/17, 25; 328/151, 328/155, 133; 307/511

[56] References Cited

U.S. PATENT DOCUMENTS

4,636,748 1/1987 Latham, II ........................ 331/17
4,668,918 5/1987 Adams ............................ 331/17 X Primary Examiner—Robert J. Pascal
Attorney, Agent, or Firm—Alvin Sinderbrand; William S. Frommer

[57] ABSTRACT

A charge pump circuit for charging a capacitor in response to a phase difference between first and second input signals comprises a constant current source for providing a first constant current; a constant current sink for absorbing a second constant current; a circuit for substantially equalizing the magnitudes of the first and second constant currents; and a switching circuit for providing the first constant current and the second constant current flowing in opposed directions to the capacitor through an output terminal of the charge pump circuit in response to the phase difference between the first and second input signals to produce a voltage level across the capacitor corresponding to the phase difference. In a phase locked loop system employing such a charge pump circuit, a phase comparator produces a phase difference signal for controlling the provision of the first and second constant currents by the switching circuit to the capacitor. The capacitor acts as a loop filter supplying the voltage thereacross as a control voltage to a voltage controlled oscillator of the phase locked loop system.

11 Claims, 5 Drawing Sheets

CHARGE PUMP CIRCUIT

BACKGROUND OF THE INVENTION

1. Field of the Invention

The present invention generally relates to charge pump circuits, for example, for use in a phase locked loop (PLL) system.

2. Description of The Prior Art

Figure 1:
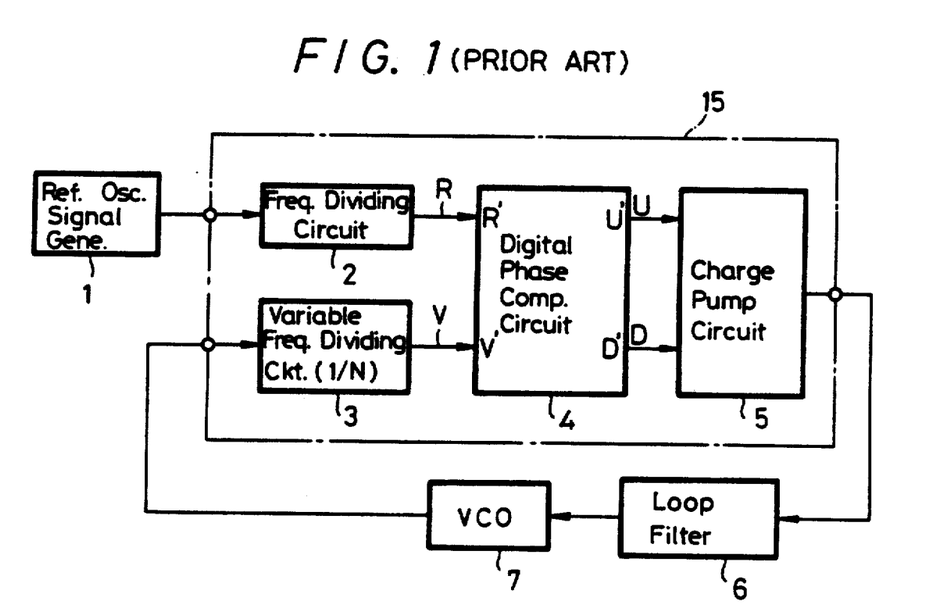
FIG. 1 is a block diagram of an exemplary prior art phase locked loop circuit utilizing a digital phase comparison circuit.

FIG. 1 illustrates a conventional PLL utilizing a digital phase comparison circuit 4. A reference oscillation signal is produced by a reference oscillation signal generating circuit 1 and is provided to a frequency-dividing circuit 2, in which it is frequency-divided to provide a frequency-divided signal R at an output terminal of the circuit 2. The frequency-divided signal R has a reference frequency, for example, of 25 kHz. The output terminal of the frequency-dividing circuit 2 is coupled with an input terminal R' of the digital phase comparison circuit 4 to provide the frequency-divided signal R thereto as a first phase comparison signal.

A voltage controlled oscillator (VCO) 7 produces an oscillation signal which it supplies to the input of a variable frequency-dividing circuit 3 simultaneously with the provision of the reference oscillation signal to the frequency-dividing circuit 2. The variable frequency-dividing circuit 3 divides the frequency of the oscillation signal from the VCO 7 by a divisor N to provide a frequency-divided signal V which it supplies to a second input terminal V' of the digital phase comparison circuit 4 as a second phase comparison signal.

Figure 2:
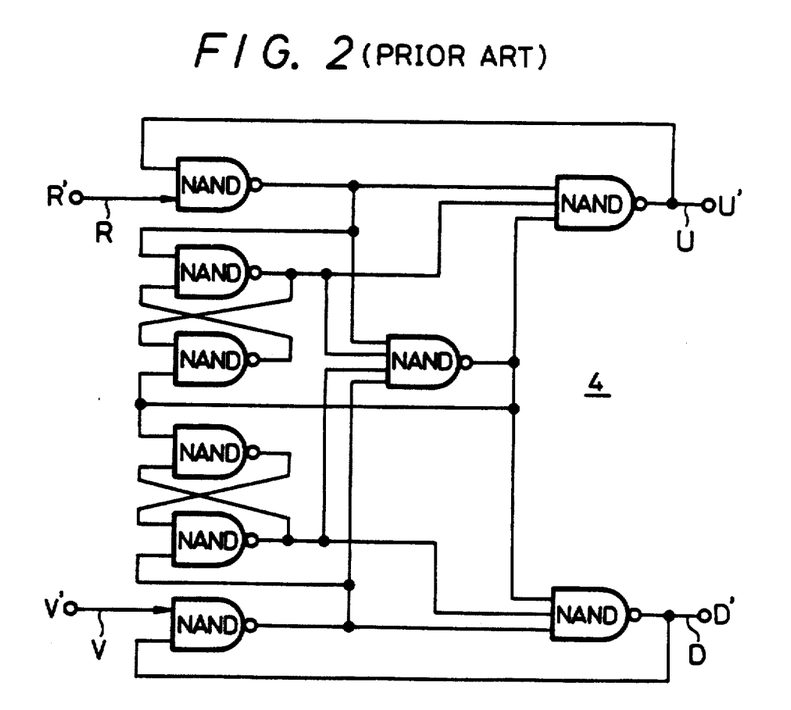
FIG. 2 is a schematic diagram of a digital phase comparison circuit incorporated in the phase locked loop circuit of FIG. 1.
Figure 3:
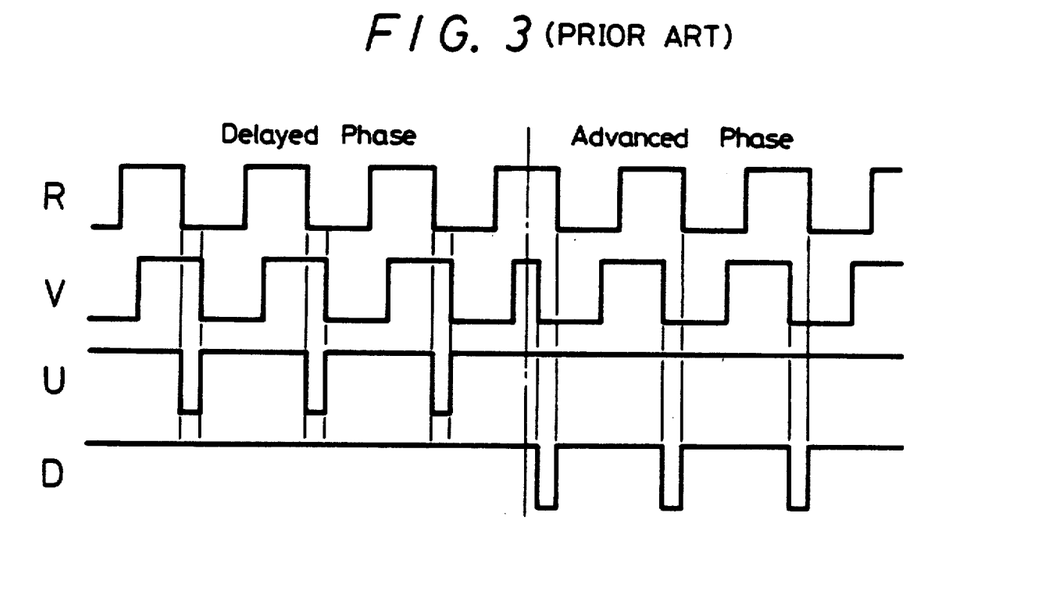
FIG. 3 is a waveform diagram of frequency-divided, phase comparison signals input to the phase comparison circuit of FIG. 2 and phase difference signals output thereby to which reference is made in explaining the operation thereof.

With reference to FIG. 2, the digital phase comparison circuit 4 includes nine NAND gates connected as shown therein. With reference also to FIG. 3, the digital phase comparison circuit 4 is operative to provide a first phase difference signal U at a first output terminal U' thereof and a second phase comparison signal D at a second output terminal D' thereof in response to a phase difference between the first and second phase comparison signals R and V received at the input terminals R' and V', respectively. More specifically, when the first phase comparison signal V is delayed in phase with respect to the second phase comparison signal R, as shown in the left side of FIG. 3, the first phase difference signal U changes from a logic "1" state (a high voltage level) to a logic "0" state (a low voltage level) upon a transition of the phase comparison signal R from a logic "1" state to a logic "0" state. The first phase difference signal U thereafter remains in the logic "0" state until the phase comparison signal V subsequently falls from a logic "1" state to a logic "0" state, whereupon the first phase difference signal U rises to a logic "1" state. The second phase difference signal D remains in a logic "1" state so long as the phase of the first phase comparison signal R leads that of the second phase comparison signal V.

However, at such times that the phase of the second phase comparison signal V leads that of the first phase comparison signal R, as shown in the right hand side of FIG. 3, the first phase difference signal U remains in a logic "1" state, while the second phase difference signal D changes from a logic "1" state to a logic "0" state when the second phase comparison signal V falls from a logic "1" state to a logic "0" state and thereafter remains in a logic "0" state until the first comparison signal R also falls from a logic "1" state to a logic "0" state, whereupon the second phase difference signal D is raised to a logic "1" state.

Figure 4:
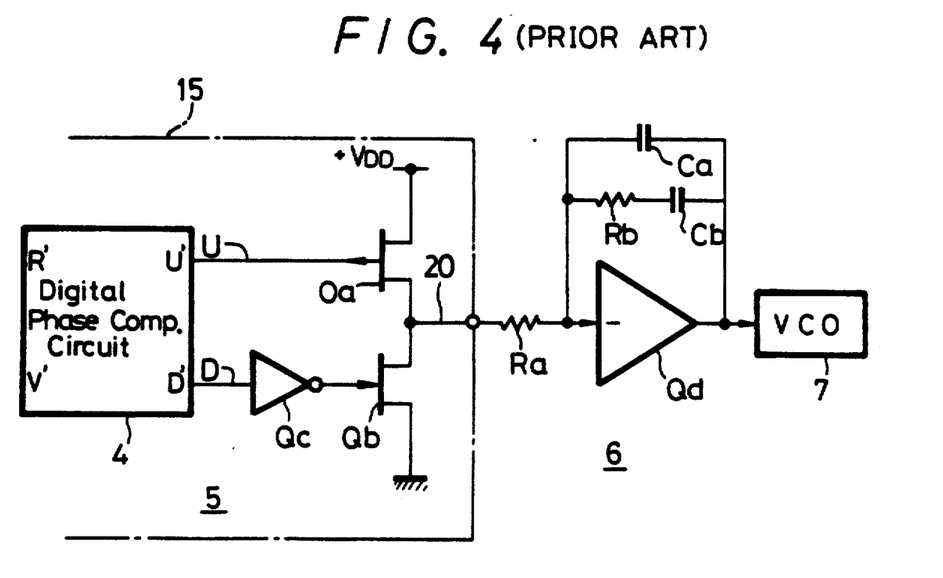
FIG. 4 is a partially schematic and partially block diagram illustrating a charge pump circuit and a loop filter incorporated in the phase locked loop circuit of FIG. 1.

With reference again to FIG. 1, the first and second phase difference signals U and D are supplied to respective inputs of a charge pump circuit 5. With reference also to FIG. 4, it will be seen that the charge pump circuit 5 includes a p-channel field effect transistor (FET) Qa whose gate is connected to output U' of the digital phase comparison circuit 4 to receive the first phase difference signal U therefrom and whose drain-source circuit is coupled between a source of positive power voltage $+H_{DD}$ and an output terminal 20 of the charge pump circuit 5. The charge pump circuit 5 also includes an n-channel FET Qb whose gate electrode is coupled through an inverter Qc with output D of the digital phase comparison circuit 4 to receive the second phase difference signal D therefrom. The source-drain path of the FET Qb is coupled between the output terminal 20 of the charge pump circuit 5 and a circuit ground.

A loop filter 6 includes an operational amplifier Qd having an inverting input terminal coupled through an input resistor Ra with the output terminal 20 of the charge pump circuit 5. An output terminal of the operational amplifier Qd is coupled with a control voltage terminal of the VCO 7. A first feedback capacitor Ca is coupled between the output terminal of the operational amplifier Qd and its inverting input terminal. A second feedback capacitor Cb has a first terminal connected with the output terminal of the operational amplifier Qd and a second terminal connected with a first terminal of a feedback resistor Rb having a second terminal connected with the inverting input terminal of the operational amplifier Qd. In this manner, the loop filter 6 takes the form of a mirror integrating circuit.

At such times that the phase of the first phase comparison signal R leads the phase of the second phase comparison V, the voltage applied to the gate of the FET Qa is periodically brought low by the first phase difference signal U to turn ON the FET Qa. Since the second phase difference signal D remains at a logic "1" state (high voltage) the gate of the FET Qb remains essentially at ground potential, so that the FET Qb is OFF. Accordingly, while the phase of the first phase comparison signal R leads that of the second phase comparison signal V, the loop filter 6 is charged by the power source voltage $+H_{DD}$ whenever the first phase difference signal U goes low in a logic "0" state. Conversely, at such times that the phase of the second phase comparison signal V leads that of the first phase comparison signal R, the FET Qa is maintained in an OFF state by the high voltage level of the first phase difference signal U in the logic "1" state, while the FET Qb is turned ON periodically by the high voltage level at the output of the inverter Qc produced at such times that the second phase difference signal D is in a logic "0" state so that the loop filter 6 is then discharged through the FET Qb. However, when both of the first and second phase difference signals U and D are in a logic "1" state, FETs Qa and Qb are both turned OFF so that the loop filter 6 is neither charged nor discharged. Accordingly, the loop filter 6 produces a dc voltage level at the output terminal thereof corresponding with the phase difference between the first and second phase difference signals U and D.

As noted above, the dc voltage level produced at the output of the loop filter 6 is applied to the control voltage terminal of the VCO 7 so that, in a stationary state, the VCO 7 produces an oscillation signal whose frequency is N times the frequency of the phase comparison signal R. The frequency dividing circuit 2, the variable frequency-dividing circuit 3, the digital phase comparison circuit 4 and the charge pump circuit 5 may be fabricated as a single chip integrated circuit 15 (see "Practical Use Guide to PLL", pages 125-127, dated Aug. 30, 1974, by Seibundoshinkosha and Japanese Laid-Open Patent No. 51-139758 published Dec. 2, 1976).

Figure 5A:
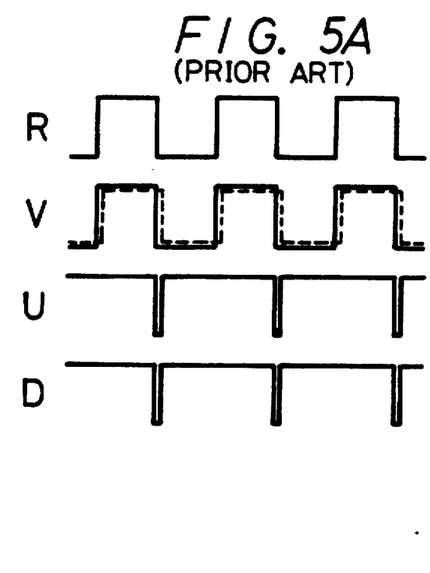
FIGS. 5A and 5B are waveform diagrams of frequency-divided, phase comparison signals input, respectively, to the phase comparison circuit of FIG. 2 and to a modified form thereof, and output phase difference signals therefrom, to which further reference is made in explaining the operation thereof.
Figure 6:
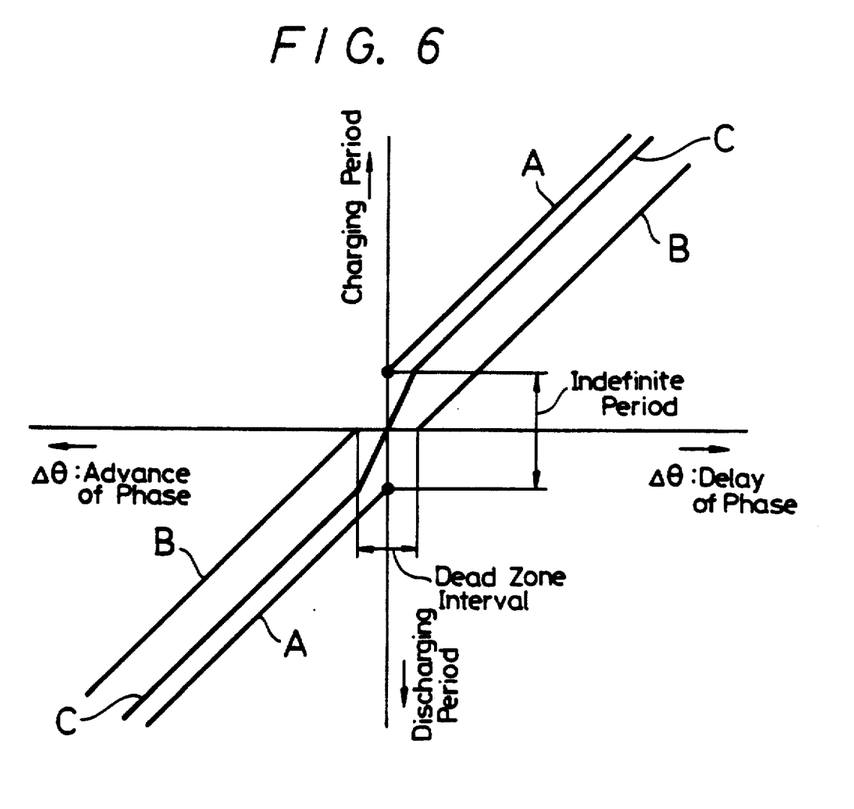
FIG. 6 is a graph of certain operational characteristics of prior art phase locked loop circuits, including the phase locked loop circuit of FIG. 1, and of the phase locked loop system of the present invention.

With reference again to FIG. 2, the phase comparison circuit 4 ideally provides the first and second phase difference signals U and D in a logic "1" state whenever the phase comparison signals R and V are in phase. However, due to the inherent propagation delays of the circuit elements comprising the phase comparison circuit 4, upon the simultaneous high to low logic state transitions of the in-phase first and second phase comparison signals R and V (as shown by the solid line waveforms in FIG. 5A) both the first and second phase difference signals U and D are then brought to a logic "0" state for a brief but significant period of time. When the second phase comparison signal V becomes delayed in phase with respect to the first phase comparison signal R by a very small amount as shown by the dashed line in FIG. 5A, the first and second phase difference signals U and D are suddenly placed in logic states similar to those illustrated in the left-hand side of FIG. 3, although a brief interval may exist during which both signals are simultaneously in a logic "0" state. Alternatively, where the second phase comparison signal V becomes advanced in phase by a very small amount with respect to the first phase comparison signal R the first and second phase difference signals U and D are suddenly placed in states similar to those illustrated in the right-hand side of FIG. 3. The resulting relationship between the phase difference $\Delta\Theta$, (that is, the phase difference of the second phase comparison signal V with respect to the first phase comparison signal R) and the charging and discharging periods controlled by the first and second phase difference signals U and D, is illustrated by the line A in FIG. 6. In FIG. 6, the axis of ordinates represents the relative charging and discharging periods of the loop filter 6, while the axis of abscissas represents the relative phase delay or advance of the second phase comparison signal V with respect to the first phase comparison signal R. It will be seen from FIG. 6 that an indefinite charging period exists where the signals R and V are either in phase or only slightly out of phase so that the operation of the PLL is unstable under such conditions.

Figure 5B:
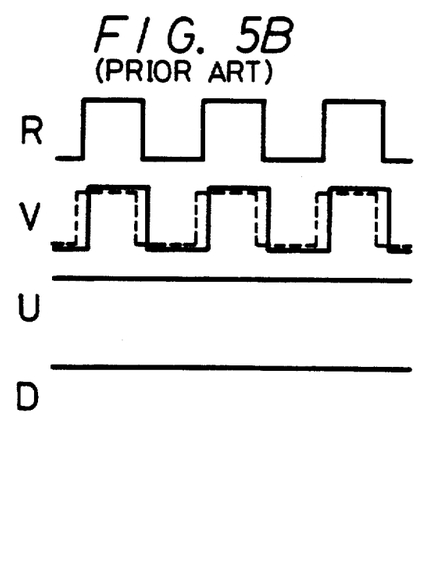

In order to overcome the foregoing problem, it has been proposed that a dead zone interval be introduced for phase differences $\Delta\Theta$ which do not exceed a predetermined magnitude, so that, when the first and second phase comparison signals R and V are in phase, the first and second phase difference signals U and D are reliably maintained in a logic "1" state. Accordingly, the combination of the operational delay times of the NAND gates and other circuit elements forming the phase comparison circuit 4 are changed so that the relationship of the charging and discharging periods to the phase difference $\Delta\Theta$ is instead expressed by the broken line b of FIG. 6. That is, even when the second phase comparison signal V is phase delayed with respect to the first phase comparison signal R by a relatively small amount (for example, as shown by the solid line waveform illustrated in FIG. 5B) or when the second phase comparison signal V is advanced in phase with respect to the first phase comparison signal R (for example, as shown by the dashed line waveform in FIG. 5B), the first and second phase difference signals U and D are maintained in a logic "1" state. Accordingly, unless the phase difference $\Delta\Theta$ exceeds a minimum predetermined magnitude defining the extremes of the dead zone interval, the charge pump circuit 5 will neither charge nor discharge the loop filter 6.

Where the phase comparison circuit 4 and the charge pump circuit 5 are constructed as above so that an indefinite charging period exists (as represented by the discontinuous line A in FIG. 6) or where a dead zone interval is provided (as shown by the broken line B of FIG. 6), the phase locked loop exhibits a different natural frequency $\omega n$ and damping coefficient $\xi$ when operating in a phase locked condition than while operating in an unlocked condition. Accordingly, the natural frequency and damping coefficient of the phase-locked loop cannot be optimized and, consequently, the purity of the oscillation frequency of the VCO 7 deteriorates. The foregoing results in the deterioration of the carrier-to-noise ratio where, for example, the output of the VCO 7 is utilized to provide a local oscillation signal for a radio receiver. Moreover, where the conventional phase locked loop as described above, is utilized for FM modulation, the modulated output signal exhibits distortion as a consequence of deterioration in the purity of the oscillation frequency.

A further disadvantage inherent in the conventional phase locked loop described above is an unavoidable dependency between the loop gain and the cut-off frequency of the loop filter 6. That is, although the loop gain can be adjusted by selecting the ratio between the resistance values of the resistors Ra and Rb, this likewise changes the cut-off frequency of the loop filter 6. The design of the conventional phase locked loop, therefore, is inherently inflexible. In addition, the conventional phase locked loop requires the use of the operational amplifier Qd for constructing the loop filter 6, resulting in a poor space factor and increased cost.

OBJECTS AND SUMMARY OF THE INVENTION

Accordingly, it is an object of this invention to provide an improved charge pump circuit and an improved phase locked loop system which avoid the above mentioned disadvantages and problems associated with the prior art.

More specifically, it is an object of the present invention to provide a charge pump circuit for a phase locked loop which is capable of more reliably charging and discharging a loop filter thereof in proportion to a phase difference which is arbitrarily small.

Another object of the present invention is to provide a charge pump circuit capable of reducing the lock-up time of a phase locked loop system to thereby provide stable operation.

Still another object of the present invention is to provide a phase locked loop system employing a charge pump circuit for charging a loop filter wherein the cut-off frequency of the loop filter is independent of the loop gain of the phase locked loop system, and vice versa.

Yet another object of the present invention is to provide a phase locked loop system which has an advantageous space factor and which can be made inexpensively.

In accordance with an aspect of the present invention, a charge pump circuit for charging capacitive means in response to a phase difference between first and second input signals comprises constant current source means for providing a first constant current; constant current sinking means for absorbing a second constant current; means for substantially equalizing the magnitudes of the first constant current provided by the constant current source means and the second constant current absorbed by the constant current sinking means; and switching means for providing the first constant current and the second constant current flowing in opposed directions to said capacitive means through an output terminal of the charge pump circuit in response to the phase difference between the first and second input signals for selectively charging and discharging the capacitive means to produce a voltage level thereof corresponding to the phase difference.

In accordance with another aspect of this invention, a phase locked loop system comprises means for receiving a reference signal; voltage controlled oscillator means for providing a phase adjustable output signal controllable by a control voltage applied at a control terminal thereof; means for producing a phase difference signal representative of a phase difference between the reference signal and the phase adjustable output signal of the voltage controlled oscillator means; means for producing the control voltage including constant current source means for providing a first constant current, constant current sinking means for absorbing a second constant current, means for substantially equalizing the magnitudes of the first current provided by the constant current source means and the second constant current absorbed by the constant current sinking means, capacitive means for producing the control voltage, and switching means for providing the first constant current and the second constant current flowing in opposed directions to the capacitive means in response to the phase difference signal for selectively charging and discharging the capacitive means to produce the control voltage corresponding to the phase difference signal; and means for applying the control voltage produced by the capacitive means to the control terminal of the voltage control oscillator means.

These, and other objects, features and advantages of the invention, will be apparent in the following detailed description of certain illustrative embodiments thereof which is to be read in conjunction with the accompanying drawings forming a part hereof, and wherein corresponding parts and components are identified by the same reference numerals in the several views of drawings.

DETAILED DESCRIPTION OF THE CERTAIN PREFERRED EMBODIMENTS

Figure 7:
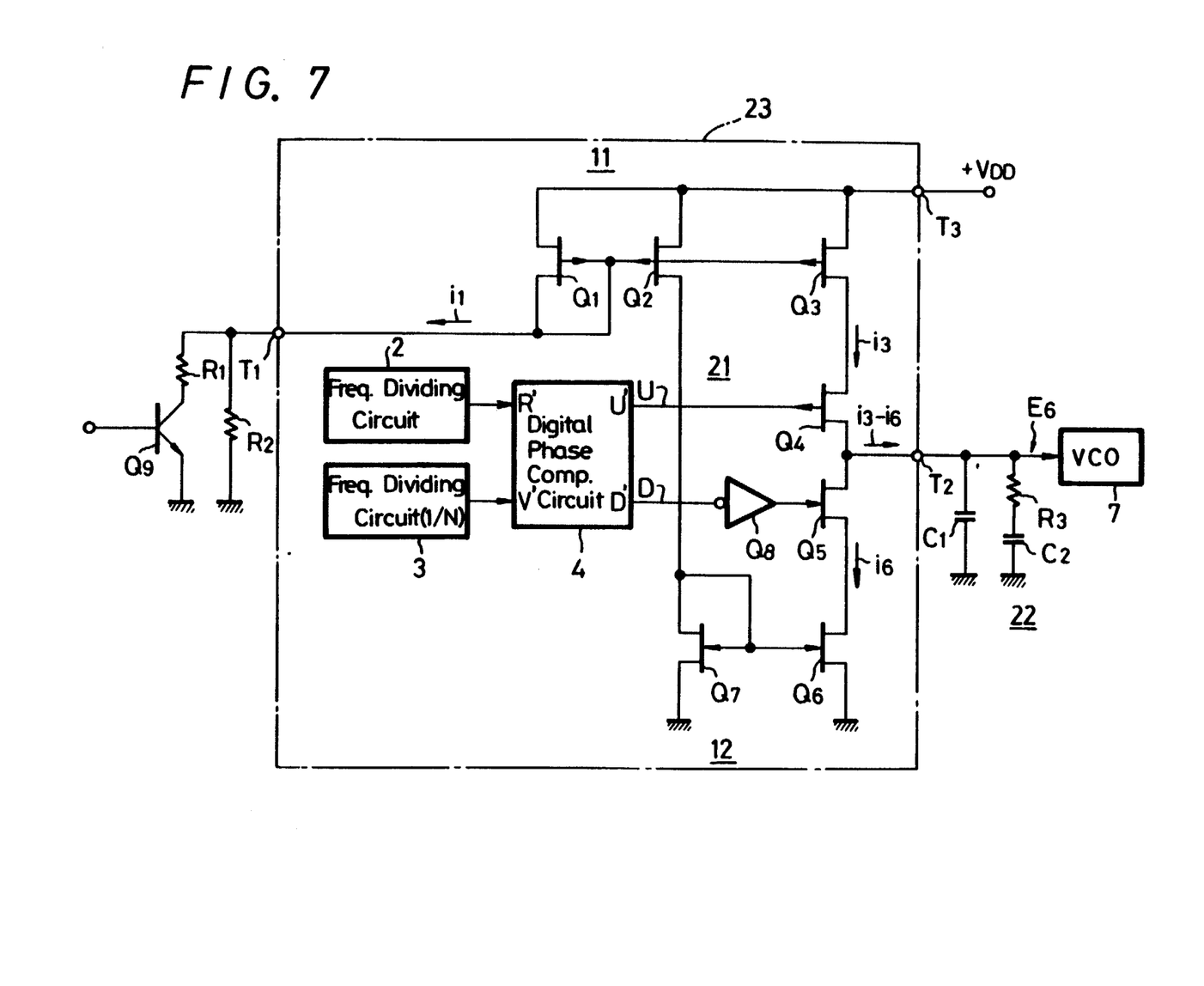
FIG. 7 is a partially block and partially schematic circuit diagram illustrating a first embodiment of a charge pump circuit and phase locked loop system in accordance with the present invention.

With reference to FIG. 7, a phase locked loop system in accordance with a first embodiment of the present invention is illustrated therein. Elements of the FIG. 7 embodiment corresponding to elements shown in FIG. 1 bear the same reference numerals.

In a charge pump circuit 21 of the FIG. 7 embodiment, the source-drain paths of p-channel FETs $Q_3$ and $Q_4$ are connected in series between a positive voltage power source terminal $T_3$ and an output terminal $T_2$ of the charge pump circuit 21. Charge pump circuit 21 also includes n-channel FETs $Q_5$ and $Q_6$ whose drain-source paths are connected in series between the output terminal $T_2$ and circuit ground. The FET $Q_3$ is a current source transistor which supplies a charging current $i_3$ of constant magnitude in a first direction toward the output terminal $T_2$ for charging a loop filter 22 described in greater detail hereinbelow. The FET $Q_6$ is a current sink transistor which draws a discharging current $i_6$ of constant magnitude in a second direction from the output terminal $T_2$ to circuit ground for discharging the loop filter 22. The FET $Q_4$ acts as a first switching transistor for controlling the application of the charging current $i_3$ supplied by the current source transistor $Q_3$, while the FET $Q_5$ serves as a second switching transistor for controlling the flow of the discharging current $i_6$ from the output terminal $T_2$ to ground through the current sink transistor $Q_6$.

A current mirror circuit 11 includes a p-channel FET $Q_1$ at an input side thereof, the FET $Q_1$ having a source electrode connected with terminal $T_3$ and drain and gate electrodes both connected to a control terminal $T_1$ of the charge pump circuit 21. The FET $Q_3$ is arranged at an output side of the current mirror circuit 11 such that its gate electrode is coupled with that of the FET $Q_1$. A further p-channel FET $Q_2$ is also connected at the output side of the current mirror circuit 11 such that its gate electrode is coupled with that of the FET $Q_1$ and its source electrode is connected with that of FET $Q_1$ to the terminal $T_3$.

A second current mirror circuit 12 includes an n-channel FET $Q_7$ whose source electrode is connected to circuit ground and whose drain and gate electrodes are connected with the drain electrode of the FET $Q_2$. The current sink transistor $Q_6$ forms the output side of the current mirror circuit 12 such that its gate electrode is connected with that of the FET $Q_7$.

The output terminal U' of the digital phase comparison circuit 4 is connected to the gate electrode of the first switching transistor $Q_4$ and the output terminal D' of the digital phase comparison circuit 4 is coupled through an inverter $Q_8$ to the gate electrode of the second switching transistor $Q_5$. The digital phase comparison circuit 4 and the charge pump circuit 21 together with the frequency-dividing circuits 2 and 3, are fabricated as an integrated circuit 23, as indicated in FIG. 7.

A resistor $R_2$ is connected between the control terminal $T_1$ and circuit ground. A resistor $R_1$ has a first terminal connected to the control terminal $T_1$ and a second terminal connected with the collector of an non transistor $Q_9$ whose emitter is connected to circuit ground.

The loop filter 22 includes a capacitor $C_1$ connected between the output terminal $T_2$ and circuit ground. The loop filter 22 further includes a resistor $R_3$ having a first terminal connected with the output terminal $T_2$ of the charge pump circuit 21, and a capacitor $C_2$ having a first terminal connected with a second terminal of the resistor $R_3$ and a second terminal connected with the circuit ground. The loop filter 22 produces a voltage $E_6$ at the terminal $T_2$ which the loop filter 22 supplies to the control terminal of the VCO 7.

The digital phase comparison circuit 4 receives the first and second phase comparison signals R and V as inputs and produces the first and second phase difference signals U and D as outputs, as discussed above in connection with FIGS. 3 and 5A. Accordingly, the relationship of the first and second phase difference signals U and D produced by the phase comparison circuit 4 to the phase difference between the first and second phase comparison signals R and V provided as inputs thereto is expressed essentially by the discontinuous line A of FIG. 6.

In operation, the current $i_1$ flowing in the FET $Q_1$ has a constant magnitude depending on a signal level applied to the base of the transistor $Q_9$, as discussed more fully hereinbelow. Since the FETs $Q_1$ and $Q_3$ form respective input and output portions of the current mirror circuit 11, the magnitude of the current $i_3$ flowing in the source-drain path of the FET $Q_3$ will be equal to that of the current $i_1$ of the FET $Q_1$. Since the FETs $Q_1$ and $Q_2$ likewise form respective input and output portions of the current mirror circuit 11, the current flowing in the source-drain path of the FET $Q_2$ is also equal in magnitude to that of the current $i_1$ and, therefore, to that of the current $i_3$. Since the FETs $Q_7$ and $Q_6$ constitute input and output portions, respectively, of the current mirror circuit 12, the current $i_6$ flowing in the source-drain path of the FET $Q_6$ is equal to the current flowing in the source-drain path of the FET $Q_7$. Since the current flowing in the source-drain path of the FET $Q_7$ is equal to that flowing in the source-drain path of the FET $Q_2$ and, therefore, is also equal to that of $i_3$, it is apparent that the magnitudes of the currents $i_3$ and $i_6$, when permitted to flow through the switching transistors $Q_4$ and $Q_5$, respectively, will have the same magnitude. Accordingly, the charge pump circuit 21 forces the magnitudes of the currents $i_3$ and $i_6$ to equal that of the reference current $i_1$ whenever the respective switching transistors $Q_4$ and $Q_5$ are turned ON.

In operation, where the phase comparison signal V is phase delayed with respect to the phase comparison signal R such that the phase difference signal U is in a logic "0" state and the phase difference signal D is in a logic "1" state, the switching transistor $Q_4$ is turned ON and the switching transistor $Q_5$ is turned OFF. Accordingly, the constant current $i_3$ is then provided to the loop filter 22 to charge the capacitors $C_1$ and $C_2$ to increase the level of the output voltage $E_6$ of the loop filter 22. Consequently, the phase (that is, the oscillation frequency) of the oscillation signal produced by the VCO 7 is advanced. Since the capacitors $C_1$ and $C_2$ are charged by a current $i_3$ having a constant magnitude, the voltage level $E_6$ is linearly increased thereby.

When the second phase comparison signal V is phase advanced with respect to the first phase comparison signal R so that the first phase difference signal U is in a logic "1" state while the second phase difference signal D is in a logic "0" state, the first switching transistor $Q_4$ is then turned OFF while the second switching transistor $Q_5$ is turned ON such that the capacitors $C_1$ and $C_2$ are thereby discharged by the constant current $i_6$. Consequently, this simultaneously decreases the level of the output voltage $E_6$ of the loop filter 22 in a linear fashion, such that the phase of the oscillation signal produced by the VCO 7 is delayed.

Furthermore, at such times that the first and second phase comparison signals R and V are in phase such that the first U and second phase difference signals U and D are in a logic "1" state, the first and second switching transistors $Q_4$ and $Q_5$ are both turned OFF, so that neither the current $i_3$ nor the current $i_6$ is permitted to flow to the output terminal $T_2$. Consequently, the capacitors $C_1$ and $C_2$ are neither charged or discharged and the output voltage level $E_6$ is maintained at a constant value such that the phase of the oscillation signal produced by the VCO 7 is likewise unchanged.

As noted above, where the phase comparison signals R and V are in phase, during a short period of time commencing from the trailing edges of the phase comparison signals R and V, both of the first and second phase difference signals U and D switch to a logic "0" state before returning to a logic "1" state at the end of the short time period. Since, however, the magnitudes of the charging and discharging currents $i_3$ and $i_6$, respectively, are equal, they add to zero when both of the first and second switching transistors $Q_4$ and $Q_5$ are turned ON by the logic "0" levels of the first and second phase difference signals U and D. Accordingly, the capacitors $C_1$ and $C_2$ of the loop filter 22 are neither charged nor discharged at such time and the level of the output voltage $E_6$ is maintained at a constant value so that the phase of the oscillation signal produced by the VCO 7 is unchanged.

With reference again to FIG. 6, the continuous line C indicates the relationship of the phase difference $\Delta\Theta$ between the phase comparison signals V and R input to the phase comparison circuit 4 and the charging and discharging periods produced in response thereto by the charge pump circuit 21. It will be seen therefrom that a linear relationship exists between the phase difference $\Delta\Theta$ and the resulting charging and discharging periods. Since the charge pump circuit 21 supplies charging and discharging currents $i_3$ and $i_6$, respectively, which have a constant magnitude, it will be appreciated that the FIG. 7 embodiment provides a linear relationship between the phase difference $\Delta\Theta$ and the control voltage $E_6$ even at arbitrarily small phase differences. Accordingly, the phase of the oscillation signal produced by the VCO 7 varies linearly with the phase difference $\Delta\Theta$ between the first and second phase comparison signals R and V.

When the transistor $Q_9$ is turned OFF, the reference current $i_1$ flows through the resistor $R_2$ only, such that the reference current $i_1$ is maintained at a relatively low value by the relatively high impedance presented by the resistor $R_2$ alone. When however, the transistor $Q_9$ is turned ON, the current $i_1$ is able to flow through the parallel combination of resistors $R_1$ and $R_2$, such that the magnitude of the current $i_1$ flowing through the FET $Q_1$ is increased. Since the currents $i_3$ and $i_6$ are equal in magnitude to the reference current $i_1$, it will be seen that a means is provided for adjusting the magnitudes of the constant currents $i_3$ and $i_6$ by controlling the ON-OFF states of the transistor $Q_9$. Since the output voltage $E_6$ of the loop filter 22 varies linearly with the magnitudes of the currents $i_3$ and $i_6$, it will be seen that, by adjusting the magnitudes of the constant currents $i_3$ and $i_6$ by selecting the ON-OFF states of the transistor $Q_9$, the loop gain of the phase locked loop is thereby adjusted. It will also be appreciated that the lock-up time of the phase locked loop can be selectably reduced by increasing the loop gain in the foregoing manner. Since the cut-off frequency of the loop filter 22 is determined only by the capacitors $C_1$ and $C_2$ and the resistor $R_3$, whose values are unaffected by the magnitudes of the charging and the discharging currents $i_3$ and $i_6$, the cut-off frequency of the loop filter 22 is unaffected by adjusting the loop gain in the foregoing manner. It will also be apparent that the loop gain can be made independent of the cut-off frequency.

Figure 8:
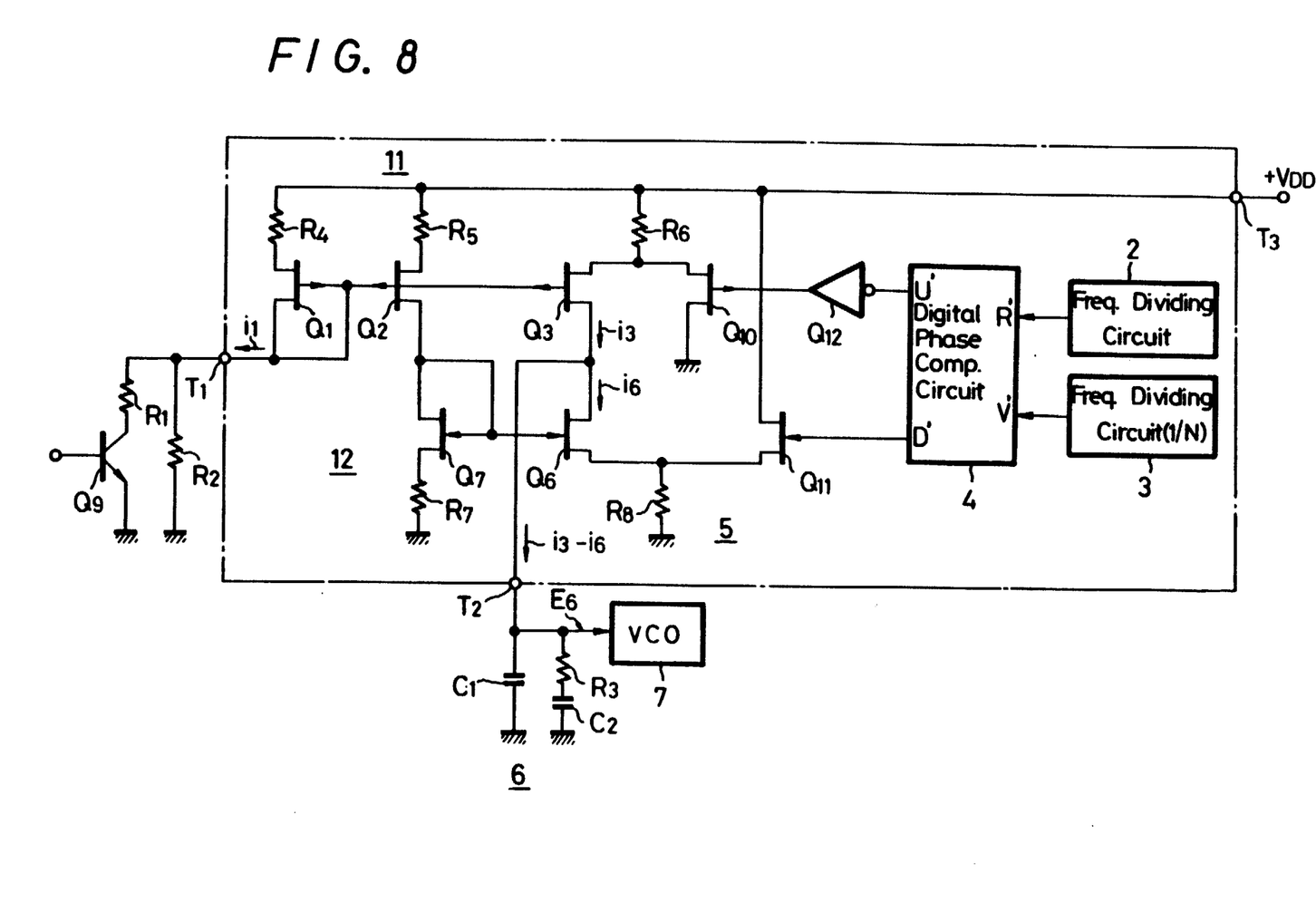
FIG. 8 is a partially schematic and partially block diagram illustrating a second embodiment of a charge pump circuit and phase locked loop system in accordance with the present invention.

With reference now to FIG. 8, a second embodiment of a phase locked loop system in accordance with the present invention is illustrated therein. Elements of the FIG. 8 embodiment corresponding to elements shown in the foregoing figures bear the same reference numerals.

In the FIG. 8 embodiment, the first and second current source transistors $Q_3$ and $Q_6$ are coupled directly to the output terminal $T_2$, while the source-drain path of the current source transistor $Q_3$ is coupled to the positive voltage power source terminal $T_3$ through a resistor $R_6$, while the source-drain path of the current sink transistor $Q_6$ is coupled to circuit ground through a resistor $R_8$. The source of the FET $Q_1$ is coupled to the positive voltage power supply terminal $T_3$ through a resistor $R_4$, while the source of the FET $Q_2$ is coupled to the positive voltage power source $T_3$ through a resistor $R_5$. The source of the FET $Q_7$ is coupled to circuit ground through a resistor $R_7$. A p-channel bypass switching FET $Q_{10}$ has its source-drain path coupled in series with the resistor $R_6$ between the terminal $T_3$ and circuit ground and has its gate electrode coupled with the output terminal U' of the phase comparison circuit 4 through an inverter $Q_{12}$. Accordingly, the bypass switching transistor $Q_{10}$ is operative to control the flow of the constant current $i_3$ supplied by the current source transistor $Q_3$ by bypassing the current $i_3$ whenever the first phase difference signal U is high.

An n-channel bypass switching FET $Q_{11}$ has its source-drain path connected in series through the resistor $R_8$ between the terminal $T_3$ and circuit ground and its gate electrode connected with the output terminal D' of the phase comparison circuit 4. Accordingly, the FET $Q_{11}$ acts as a second bypass switching transistor for controlling the flow of the constant current $i_6$ supplied by the current sink transistor $Q_6$ such that whenever the second phase difference signal supplied at the output terminal D' of the phase comparison circuit 4 is in a logic "1" state, the second bypass switching transistor $Q_{11}$ is turned ON to bypass the current $i_6$ which otherwise would flow through the current sink transistor $Q_6$. In all other respects, the operation of the FIG. 8 embodiment is identical to that of the FIG. 7 embodiment.

It will be readily appreciated by those skilled in the art that the embodiments of FIGS. 7 and 8 may be similarly constructed with the use of bipolar transistors in place of the field effect transistors (FETs) specifically disclosed herein.

Although specific embodiments of the invention have been described in detail herein with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A charge pump circuit for charging capacitive means in response to a phase difference between first and second input signals, comprising:
   constant current source means for providing a first constant current;
   constant current sinking means for absorbing a second constant current;
   an output terminal adapted to be connected to a capacitive means;
   switching means for providing said first constant current and said second constant current flowing in opposed directions through said output terminal to the capacitive means in response to said phase difference between said first and second input signals for selectively charging and discharging the capacitive means to produce a voltage level thereof corresponding to said phase difference; and
   means for substantially equalizing the magnitudes of the first constant current provided by said constant current source means and the second constant current absorbed by said constant current sinking means so that a linear relationship exists between said phase difference between said first and second input signals and the resulting charging and discharging periods of the capacitive means.

2. A charge pump circuit for charging capacitive means in response to a phase difference between first and second input signals, comprising:
   constant current source means including current source transistor means for providing a first constant current;
   constant current sinking means for absorbing a second constant current;
   means for substantially equalizing the magnitudes of the first constant current provided by said constant current source means and the second constant current absorbed by said constant current sinking means;
   an output terminal adapted to be connected to a capacitive means; and
   switching means for providing said first constant current and said second constant current flowing in opposed directions through said output terminal to the capacitive means in response to said phase difference between said first and second input signals for selectively charging and discharging the capacitive means to produce a voltage level thereof corresponding to said phase difference, said switching means including transistor means for providing the capacitive means with said first constant current flowing through said output terminal in a first direction, and said current source transistor means and said firs switching transistor means being coupled in series between a power source terminal of said charge pump circuit and said output terminal of said charge pump circuit.

3. The charge pump circuit according to claim 2, wherein said constant current sinking means comprises current sinking transistor means for absorbing said second constant current, and said switching means further comprises second switching transistor means for providing the capacitive means with said second constant current flowing through said output terminal in a second direction;

said current sinking transistor means and said second switching transistor means being coupled in series between said output terminal of said charge pump circuit and a ground of said charge pump circuit.

4. A charge pump circuit for charging capacitive means in response to a phase difference between first and second input signals, comprising:

constant current source means including current source transistor means for providing a first constant current;

constant current sinking means for absorbing a second constant current;

means for substantially equalizing the magnitudes of the first constant current provided by said constant current source means and the second constant current absorbed by said constant current sinking means;

an output terminal adapted to be connected to a capacitive mans; and switching means including first switching transistor means for bypassing current of said current source transistor means and thereby providing said first constant current and said second constant current flowing in opposed directions through said output terminal to the capacitive means in response to said phase difference between said first and second input signals for selectively charging and discharging the capacitive means to produce a voltage level thereof corresponding to said phase difference.

5. The charge pump circuit according to claim 4, wherein said constant current sinking means comprises current sinking transistor means for providing said second constant current; and said switching means comprises second switching transistor means for bypassing current of said current sinking transistor means.

6. A charge pump circuit for charging capacitive means in response to a phase difference between firs and second input signals, comprising:

constant current source means for providing a first constant current;

constant current sinking means for absorbing a second constant current;

means for substantially equalizing the magnitudes of the first and second constant currents including means for producing a third constant current substantially equal in magnitude to one of said first and second constant currents, and means for setting the other of said first and second constant currents substantially equal to said third constant current;

an output terminal adapted to be connected to a capacitive means; and switching means for providing said first constant current and said second constant current flowing in opposed directions through said output terminal to the capacitive means in response to said phase difference between said first and second input signals for selectively charging and discharging the capacitive means to produce a voltage level thereof corresponding to said phase difference.

7. The charge pump circuit according to claim 6, wherein said means for producing a third constant current comprises:

first current mirroring means for producing said third constant current such that said third constant current is substantially equal in magnitude to a predetermined reference current; and second current mirroring means for substantially equalizing the magnitude of said one of said first and second constant currents and said reference current.

8. The charge pump circuit according to claim 7, wherein said means for setting the other of said first and second constant currents substantially equal to said third constant current includes third current mirroring means for substantially equalizing the magnitude of said other of said first and second constant currents with the magnitude of said third constant current.

9. A charge pump circuit for charging capacitive means in response to a phase difference between first and second input signals, comprising:

constant current source means for providing a first constant current;

constant current sinking means for absorbing a second constant current;

means for substantially equalizing the magnitudes of the first and second constant current including means for maintaining said first constant current and said second constant current equal in magnitude to a reference current;

an output terminal adapted to be connected to a capacitive means; and switching means for providing said first constant current and said second constant current flowing in opposed directions through said output terminal to the capacitive means in response to said phase difference between said first and second input signals for selectively charging and discharging the capacitive means to produce a voltage level thereof corresponding to said phase difference.

10. The charge pump circuit according to claim 9, further comprising means for adjusting the magnitude of the reference current to thereby adjust the magnitude of said first constant current and said second constant current.

11. The charge pump circuit according to claim 1, further comprising means for adjusting the magnitudes of said first constant current and said second constant current.

* * * * *